United States Patent
Ohuchi et al.

(10) Patent No.: US 6,274,938 B1
(45) Date of Patent: Aug. 14, 2001

(54) RESIN-SEALED SEMICONDUCTOR DEVICE AND METHOD OF MANUFACTURING THE DEVICE

(75) Inventors: Shinji Ohuchi; Noritaka Anzai, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/150,044

(22) Filed: Sep. 9, 1998

(30) Foreign Application Priority Data

Sep. 10, 1997 (JP) .................................................. 9-245808

(51) Int. Cl.$^7$ ...................................................... H01L 23/29
(52) U.S. Cl. .......................... 257/795; 257/790; 438/123
(58) Field of Search ..................................... 438/106, 123, 438/124; 257/789, 790, 795

(56) References Cited

U.S. PATENT DOCUMENTS

| | | |
|---|---|---|
| 5,068,712 | 11/1991 | Murakami et al. . |
| 5,286,679 | 2/1994 | Farnworth et al. . |
| 5,300,459 | 4/1994 | Ushikubo et al. . |
| 5,466,888 | * 11/1995 | Beng et al. . |
| 5,519,251 | 5/1996 | Sato et al. . |
| 5,583,375 | 12/1996 | Tsubosaki et al. . |
| 5,759,875 | * 6/1998 | Ahmad . |

FOREIGN PATENT DOCUMENTS

| | | |
|---|---|---|
| 0 651 040 | 5/1995 | (EP) . |
| 97/29514 | 8/1997 | (WO) . |

OTHER PUBLICATIONS

Michael Pecht, Handbook of Electronic Package Design, pp. 765–772, 1991.*

"Development of a Tapeless Lead–On–Chip (LOC) Package", M. Amagai et al.; Texas Instruments Japan Limited, Miho Plant; Institute of Electrical and Electronics Engineers; May 1, 1994; pp. 506–512.

* cited by examiner

Primary Examiner—Charles Bowers
Assistant Examiner—Scott J. Hawranek
(74) Attorney, Agent, or Firm—Rabin & Champagne, P.C.

(57) ABSTRACT

A resin-sealed LOC type semiconductor device includes semiconductor chip having a circuit surface on which electrodes are formed. Leads are arranged with their distal ends overlapping the semiconductor chip, electrically connected to the respective electrodes. A lead fixing resin layer is interposed between the semiconductor chip and the leads to fix them. A sealing resin layer coats the semiconductor chip and the lead to over them. The diameter of filler contained in the lead fixing resin layer is about 1/10 to 1/5 the diameter of filler contained in the sealing resin layer, and is about 1/10 the width of a gap between each lead and the semi conductor chip.

13 Claims, 4 Drawing Sheets

RESIN-SEALED SEMICONDUCTOR DEVICE AND METHOD OF MANUFACTURING THE DEVICE

BACKGROUND OF THE INVENTION

The present invention relates to a resin-sealed semiconductor device such as an IC or an LSI and a method of manufacturing the same.

A resin-sealed semiconductor device comprises a semiconductor chip and a lead connected to the electrode of the semiconductor chip. The distal end of the lead and the semiconductor chip are sealed by a resin. The whole size of the resin-sealed semiconductor device including the sealing resin is determined by standards. And generally, the size of the semiconductor chip increases as the degree of integration of the circuit increases. When the semiconductor chip increases in size and when the distal end of the lead is arranged not to overlap the semiconductor chip, the length of a part of the lead fixed with the resin is shortened, and the lead cannot be rigidly fixed. Therefore, in this case, an LOC (Lead On Chip) type structure in which the distal end of the lead overlaps a semiconductor chip is generally employed.

Japanese Patent Application Laid-Open No. 61-218139 discloses an LOC type resin-sealed semiconductor device. In the structure disclosed in this publication, as shown in FIG. 5 of the present application, the distal end of a lead 1 is adhered to a semiconductor chip 3 through an insulating tape 4, and the distal end and an electrode 10 of the semiconductor chip 3 are connected to each other with a bonding wire 5. The semiconductor chip 3, the distal end of the lead 1, and the bonded portions are covered with the sealing resin layer 2.

The sealing resin layer 2 generally consists of an epoxy-based resin whose ratio by weight is about 20% and filler whose ratio by weight is about 80%. The filler is silica-based solid bodies each having a diameter of 50 to 100 μm and has a function of keeping the hardness of a resin layer and a function of suppressing thermal expansion.

However, since the above insulating tape 4 easily absorbs moisture, the moisture contained in the insulating tape 4 is evaporated by heat generated in practical use. Forces generated in this case disadvantageously cause cracks 6 to form in the sealing resin layer 2, as shown in FIG. 6.

As shown in FIG. 7, if the large-diameter filler 7 clogs in a gap of about 100 μm between the lead 1 and the semiconductor chip 3, stress is generated between the lead 1 and the semiconductor chip 3 when the sealing resin layer 2 is solidified. The stress is generated due to the difference between the coefficient of contraction of the sealing resin layer 2 and that of the filler 7. This stress may cause flaws 8 such as cracks in the semiconductor chip 3.

SUMMARY OF THE INVENTION

The present invention aims to solve the problems of the prior art described above, and its object is to provide a resin-sealed semiconductor device which employs an LOC type structure, suppresses formation of cracks in a sealing resin layer by heat in practical use, and can prevent flaws or cracks from forming in a semiconductor chip during solidification of the sealing resin layer.

A resin-sealed semiconductor device according to the present invention comprises: a semiconductor chip having a circuit surface on which a plurality of electrodes are formed; a plurality of leads which are arranged at predetermined gaps with respect to the semiconductor chip in such a manner that distal ends of the leads overlap the semiconductor chip, and are electrically connected to the respective electrodes; a lead fixing resin layer filled between the semiconductor chip and the leads to fix the leads to the semiconductor chip; and a sealing resin layer which is coated to cover the distal ends of the leads and the semiconductor chip, and when the lead fixing resin layer contains filler, the diameter of the filler is smaller than the diameter of filler contained in the sealing resin layer, or the lead fixing resin layer is free from filler.

When the lead fixing resin layer contains filler, the diameter of the filler is preferably about ⅒ to ⅕ the diameter of the filler contained in the sealing resin layer, or the diameter is preferably about ⅒ of gap between the leads and the semiconductor chip at an overlapping portion therebetween, i.e., the diameter is preferably about 10 μm. In addition, the percentage by weight of the filler contained in the lead fixing resin layer is preferably lower than the percentage by weight of the filler contained in the sealing resin layer.

A method of manufacturing a resin-sealed semiconductor device according to the present invention which is constituted by sealing a semiconductor chip and leads with a sealing resin layer, comprises: coating a lead fixing resin layer on a circuit surface of the semiconductor chip; fixing the distal ends of a plurality of leads to the semiconductor chip with the lead fixing resin layer; bonding the distal ends of the leads and electrodes formed on the circuit surface; and sealing the semiconductor chip and the leads with the sealing resin layer. The lead fixing resin layer contains filler having a diameter smaller than that of filler contained in the sealing resin layer, or is free from filler.

DETAILED DESCRIPTION OF THE PREFERRED EMBODIMENT

An embodiment of a resin-sealed semiconductor device according to the present invention will be described below.

Figure 1:
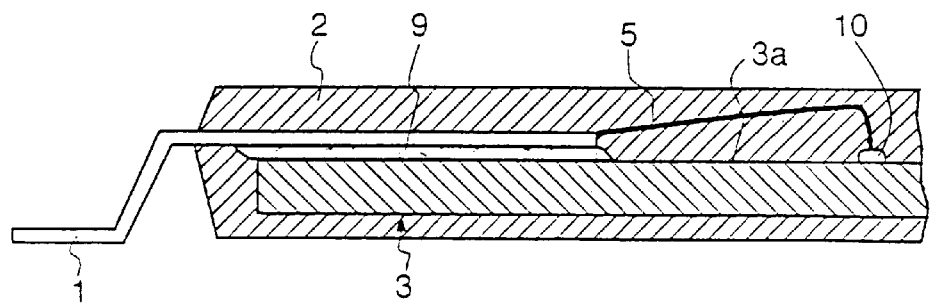
FIG. 1 is a partially sectional view of a resin-sealed semiconductor device according to an embodiment of the present invention.

A resin-sealed semiconductor device according to this embodiment, as shown in FIG. 1, is an LOC type semiconductor device comprising a semiconductor chip 3, a lead 1, a lead fixing resin layer 9 and a sealing resin layer 2.

The semiconductor chip 3 is provided with a circuit surface 3a (serving as an upper surface in FIG. 1), and an electrode 10 is formed on the circuit surface 3a. The lead 1 is arranged at a predetermined gap with respect to the semiconductor chip 3 in such a manner that the distal end of the lead 1 overlaps the semiconductor chip 3.

A bonding wire 5 electrically connects the distal end of the lead 1 and the electrode 10. The lead fixing resin layer 9 fills a space between the semiconductor chip 3 and the lead 1 to fix the lead 1 to the semiconductor chip 3. The sealing resin layer 2 is coated to cover the semiconductor chip 3 and the lead 1.

Figure 2A:
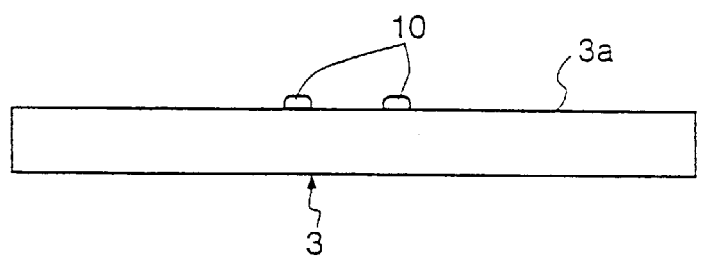
FIG. 2(A) is a side view of a semiconductor chip in the device shown in FIG. 1.
Figure 2B:
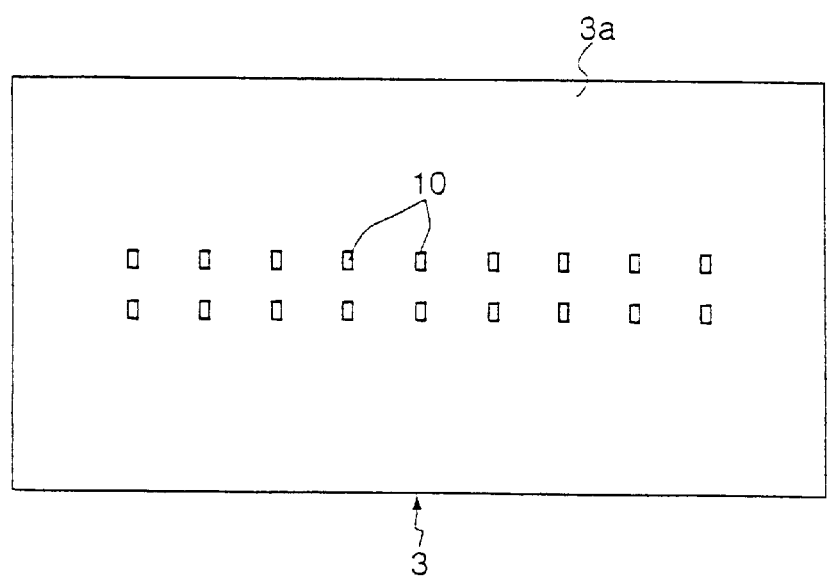
FIG. 2(B) is a plan view of the semiconductor chip in FIG. 2(A)

The electrode 10 is formed on the semiconductor chip 3 such that a plurality of electrodes 10 are arranged in two lines at the central portion of the circuit surface 3a as shown in the side view of FIG. 2(A) and the plane view of FIG. 2(B) the plane. The lead 1 connected to the electrodes 10 is formed such that a plurality of leads 1 are arranged in correspondence with the number of electrodes.

The gap between the circuit surface 3a of the semiconductor chip 3 and the distal end of the lead 1 is about 40 to 100 μm. The lead fixing resin fills the gap between the lead 1 and the circuit surface 3a over a range from the distal end of the lead 1 to the periphery of the semiconductor chip 3, i.e., a range in which the lead 1 overlaps the semiconductor chip 3.

The sealing resin layer 2 contains filler having a diameter of 50 to 100 μm at a percentage by weight of about 80%, and the remaining 20% is an epoxy-based resin. On the other hand, the lead fixing resin layer 9 also consists of filler and an epoxy-based resin. However, the diameter of the filler is about $\frac{1}{10}$ to $\frac{1}{5}$ of the diameter of the filler contained in the sealing resin layer 2, and is about $\frac{1}{10}$ the width of the gap between the lead 1 and the semiconductor chip 3 at the overlapping portion therebetween. The percentage by weight of the filler contained in the lead fixing resin layer 9 is set to be lower than the percentage by weight of the filler contained in the sealing resin layer 2. More specifically, the lead fixing resin layer 9 contains filler which has a diameter of about 10 μm and whose percentage by weight is about 40%, and the remaining 60% consists of an epoxy-based resin.

As described above, when the resin layer 9 is used in place of a conventional insulating tape to fix the lead 1, a moisture content in the fixed portion decreases. For this reason, evaporation generated by heat in practical use can be suppressed, and the probability of forming cracks in the sealing resin layer 2 can be reduced. When the filler content is smaller than that in the sealing resin layer 2, the probability of filler clogging a space between the lead 1 and the circuit surface 3a can be reduced. When the diameter of filler itself is reduced, the filler can be prevented from clogging. Therefore, stress based on the difference between the coefficient of contraction of the resin and the coefficient of contraction of the filler in solidification of a sealing resin, can be prevented from developing, so that the semiconductor chip 3 can be prevented from cracking.

Although the above example explains a case wherein the lead fixing resin layer 9 contains filler, a material free of filler can also be used as the lead fixing resin layer 9.

A method of manufacturing a resin-sealed semiconductor device according to the embodiment will be described below. This manufacturing method comprises: (1) coating the lead fixing resin layer 9 on the circuit surface 3a of the semiconductor chip 3; (2) fixing the distal ends of the plurality of leads 1 to the semiconductor chip 3 with the lead fixing resin layer 9; (3) bonding the distal ends of the leads 1 and the electrodes 10 formed on the circuit surface 3a to each other; and (4) sealing the semiconductor chip 3 and the leads 1 with the sealing resin layer 2. The respective steps will be sequentially described below.

Figure 3:
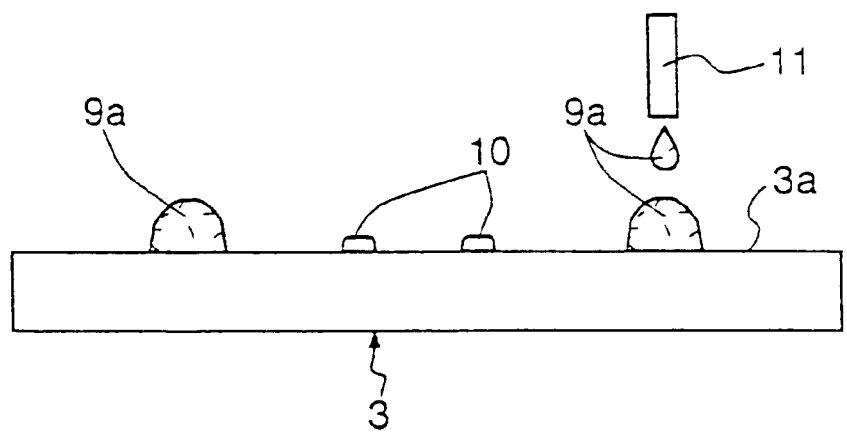
FIG. 3(A) is a side view showing of the device in a state wherein a resin for a lead fixing resin layer is coated on the semiconductor chip in FIG. 2.
FIG. 3(B) is a plan view showing the device of FIG. 3(A)
Figure 3:
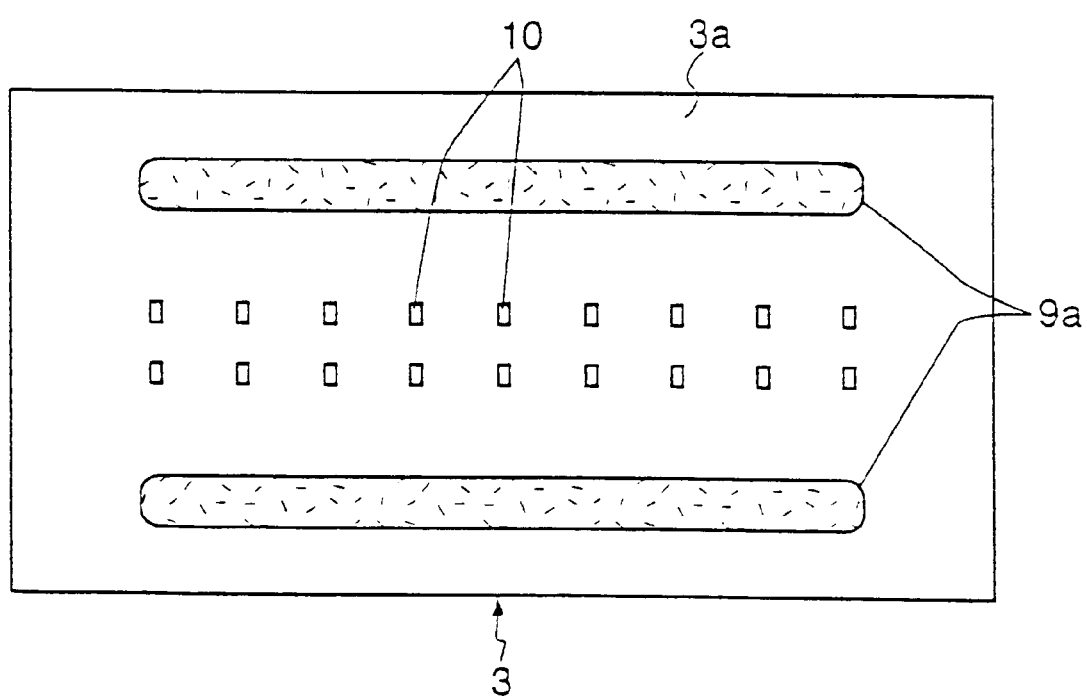

In the first step, as shown in FIG. 3(A) and FIG. 3(B) a resin 9a for forming the lead fixing resin layer 9 is liquefied, and the liquid resin 9a is supplied from a dispenser 11 onto the circuit surface 3a. The resin 9a is coated on a position where the leads 1 are fixed, i.e., both sides of electrode rows in the arrangement direction of the electrodes 10. The coated liquid resin 9a initially has a hemispheric shape in the first step.

Figure 4:
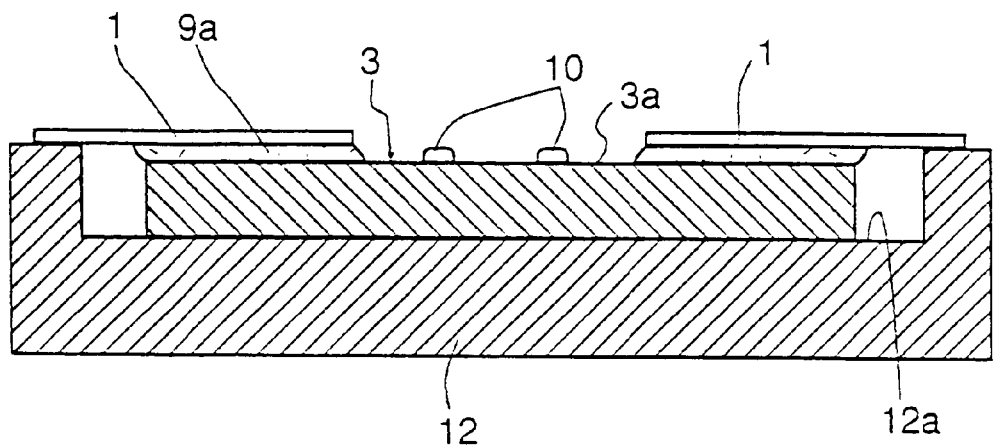
FIG. 4(A) is a side view showing the device of the invention in a state wherein a lead is fixed to the semiconductor chip shown in FIG. 3.
FIG. 4(B) is a plan view showing the device of the invention in FIG. 4(A)
Figure 4:
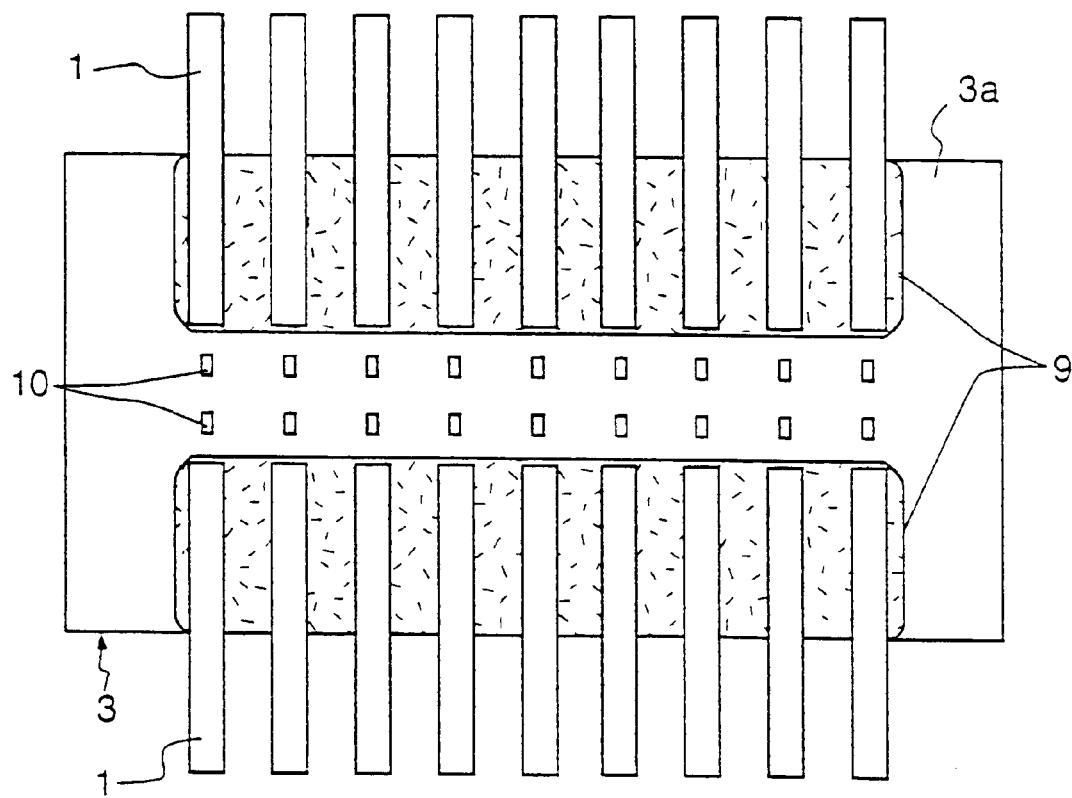
Figure 5:
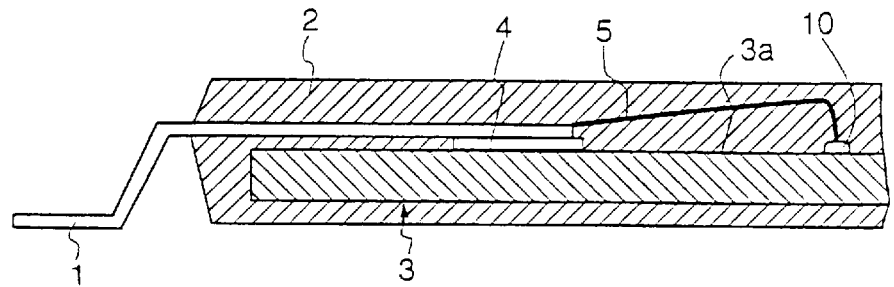
FIG. 5 is a partially sectional view of a conventional resin-sealed semiconductor device.
Figure 6:
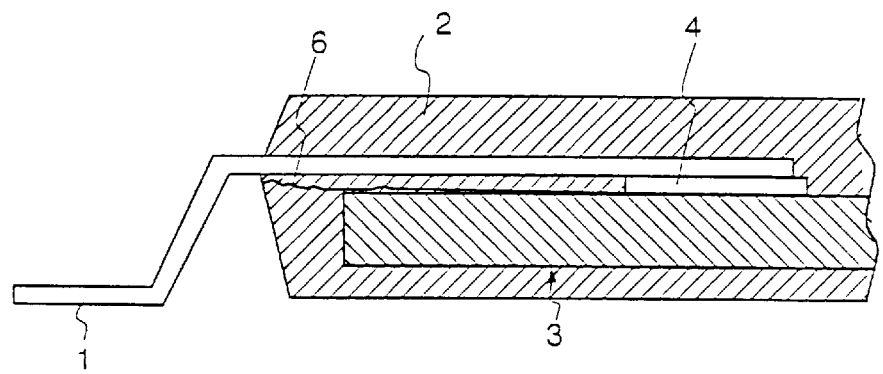
FIG. 6 is a partially sectional view showing a problem of the conventional resin-sealed semiconductor device.
Figure 7:
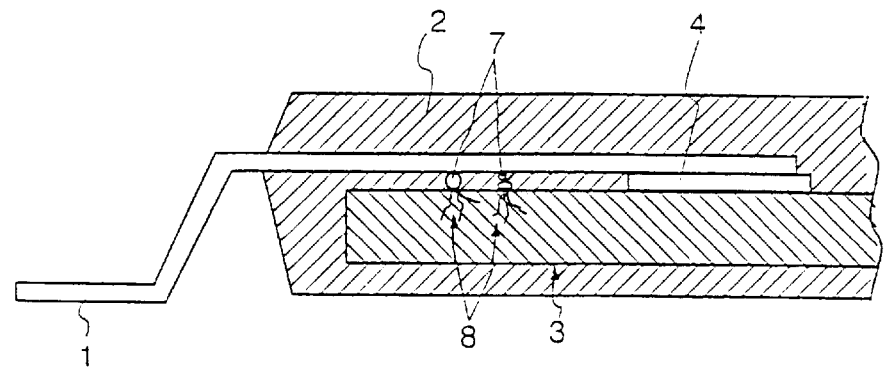
FIG. 7 is a partially sectional view showing another problem of the resin-sealed semiconductor device.

In the second step, as shown in FIG. 4(A), the semiconductor chip 3 is set in a recessed portion 12a formed in a heat block 12, and the plurality of leads 1 are pressed against the liquid resin 9a from the upper side of FIG. 4(A) to spread the liquid resin 9a. The heat block 12 is kept at a temperature of 80° C. to 100° C., and the lead fixing resin layer 9 serving as a thermosetting resin is solidified for about one minute. The depth of the recessed portion 12a is set such that the level of the circuit surface 3a is lower than a peripheral surface surrounding of the recessed portion 12a by 40 to 100 μm. The lead 1 is arranged to extend from both the sides of the semiconductor chip 3 to the central electrode 10 as shown in FIG. 4(B) and the lead 1 is fixed to the semiconductor chip 3 with the lead fixing resin layer 9.

In the third step, the electrode 10 of the semiconductor chip 3 is electrically connected to the distal end of the lead 1 fixed to the semiconductor chip 3 in the second step by bonding with the wire 5. And in the fourth step, the semiconductor chip 3, the distal end of the lead 1, and the wire 5 are sealed with the sealing resin layer 2, and the sealing resin layer 2 is solidified. Thereafter, lead processes such as diver cutting, lead cutting, and lead bending are performed to complete the semiconductor device shown in FIG. 1.

As described above, according to the present invention, when a lead fixing resin layer is used to fix a lead before bonding to a semiconductor chip, the moisture content in the fixed portion decreases. For this reason, steam generated by heat in practical use can be suppressed, and the probability of forming cracks in the sealing resin layer can be reduced. In addition, when the diameter of the filler contained in the lead fixing resin layer is reduced, the probability of clogging by the filler of the space between the lead and the semiconductor chip can be reduced. When the diameter of filler itself is reduced, the filler can be prevented from clogging, and the semiconductor can be prevented from being cracked in solidification of the sealing resin.

Furthermore, when the filler content in the lead fixing resin layer is made smaller than that in the sealing resin layer, probability of the filter clogging space between the lead and the circuit surface can be reduced. When a resin free of filler is used, filler clogging can be canceled. In this manner, stress based on the difference between the coefficient of contraction of the resin and the coefficient of contraction of the filler in solidification of the sealing resin can be prevented, so that cracking of the semiconductor chip can be prevented, being cracked.

What is claimed is:

1. A resin-sealed semiconductor device, comprising:
a semiconductor chip having a circuit surface on which a plurality of electrodes are formed,
a plurality of leads which are arranged side-by-side with gaps therebetween on said semiconductor chip in such a manner that distal ends of said leads overlap said semiconductor chip and are respectively electrically connected to said electrodes;

a lead fixing resin layer between said semiconductor chip and said leads fixing said leads to said semiconductor chip; and a sealing resin layer coating the distal ends of said leads and said semiconductor chip, wherein both said lead fixing resin layer and said sealing resin layer contain filler, the diameter of the filler contained in said lead fixing resin layer being signaler than the diameter of filler contained in said sealing resin layer;

wherein said lead fixing resin layer consists essentially of a lead fixing resin and the filler;

wherein said lead fixing resin layer is free of an adhesive layer other than said lead fixing resin; and wherein said lead fixing resin layer extends continuously from the respective distal ends of said leads to at least an outer periphery of the chip.

2. A resin-sealed semiconductor device according to claim 1, wherein the diameter of the filler contained in said lead fixing resin layer is about 1/10 to 1/5 the diameter of the filler contained in said sealing resin layer.

3. A resin-sealed semiconductor device according to claim 1, wherein the diameter of the filler contained in said lead fixing resin layer is about 1/10 the width of a gap between said leads and said semiconductor chip at an overlapping portion therebetween.

4. A resin-sealed semiconductor device according to claim 1, wherein the diameter of the filler contained in said lead fixing resin layer is about 10 μm.

5. A resin-sealed semiconductor device according to claim 1, wherein the percentage by weight of the filler contained in said lead fixing resin layer is lower than the percentage by weight of the filler contained in said sealing resin layer.

6. A resin-sealed semiconductor device according to claim 1, wherein the lead fixing resin layer is a single layer of the lead fixing resin, said single layer having an upper surface and having a lower surface on the circuit surface, said distal ends of said leads being fixed at said upper surface of said single layer.

7. A semiconductor device, comprising:

a semiconductor chip having a circuit surface on which a plurality of electrodes are formed;

a lead fixing resin formed on the circuit surface of the chip, said lead fixing resin containing filler;

a plurality of leads fixed on the circuit surface of the chip by the lead fixing resin, said leads being electrically connected to the electrodes; and a sealing resin covering distal ends of said leads and covering the circuit surface of the chip, said sealing resin containing filler the diameter of which is larger than the diameter of the filler contained in the lead fixing resin, a lead fixing resin formed on the circuit surface of the chip, said lead fixing resin containing filler;

a plurality of leads fixed on the circuit surface of the chip by the lead fixing resin, said leads being electrically connected to the electrodes; and a sealing resin covering distal ends of said leads and covering the circuit surface of the chip, said sealing resin containing filler the diameter of which is larger than the diameter of the filler contained in the lead fixing resin, wherein a layer disposed between said respective leads and the circuit surface of the chip includes said lead fixing resin as an adhesive layer, so that said lead fixing resin fixes the respective leads directly to the circuit surface of the chip; and wherein said lead fixing resin extends continuously from the respective distal ends of said leads to at least an outer periphery of the chip.

8. A semiconductor device according to claim 7, wherein said lead fixing resin is formed from the distal end of the leads to the periphery of the semiconductor chip.

9. A semiconductor device according to claim 8, wherein the diameter of the filler contained in said lead fixing resin, layer is about 1/10 to 1/5 the diameter of the filler contained in said sealing resin layer.

10. A semiconductor device according to claim 8, wherein the diameter of the filler contained in said lead fixing resin layer is about 1/10 the width of a gap between said leads and said semiconductor chip at an overlapping portion therebetween.

11. A semiconductor device according to claim 8, wherein the diameter of the filler contained in said lead fixing resin layer is about 10 μm.

12. A semiconductor device according to claim 10, wherein the percentage by weight of the filler contained in said lead fixing resin layer is lower that the percentage by weight of the filler contained in said sealing resin layer.

13. A semiconductor device according to claim 7, wherein the lead fixing resin is a single layer of the lead fixing resin, said single layer having an upper surface and having a lower surface on the circuit surface, said distal ends of said leads being fixed at said upper surface of said single layer.

* * * * *